(12) United States Patent
Moore et al.

(10) Patent No.: US 7,208,724 B2
(45) Date of Patent: Apr. 24, 2007

(54) APPARATUS AND METHOD OF DETECTING PROBE TIP CONTACT WITH A SURFACE

(75) Inventors: Thomas Moore, Dallas, TX (US); Lyudmila Zaykova-Feldman, Dallas, TX (US)

(73) Assignee: Omniprobe, Inc., Dallas, TX (US)

( * ) Notice: Subject to any disclaimer, the term of this patent is extended or adjusted under 35 U.S.C. 154(b) by 0 days.

(21) Appl. No.: 11/266,678

(22) Filed: Nov. 3, 2005

(65) Prior Publication Data

US 2006/0091302 A1    May 4, 2006

Related U.S. Application Data

(60) Provisional application No. 60/624,650, filed on Nov. 3, 2004.

(51) Int. Cl.
*H01J 3/14* (2006.01)
*G01J 5/08* (2006.01)
*G01B 5/28* (2006.01)
*G01R 31/02* (2006.01)

(52) U.S. Cl. .................. 250/234; 250/227.11; 73/105; 324/758

(58) Field of Classification Search ........... 250/227.11, 250/227.14, 234, 306; 356/615; 73/105; 324/758
See application file for complete search history.

(56) References Cited

U.S. PATENT DOCUMENTS 5,324,935 A * 6/1994 Yasutake .................... 250/234
5,479,024 A * 12/1995 Hillner et al. ........... 250/458.1
5,991,040 A    11/1999 Doemens et al.
6,570,156 B1   5/2003 Tsuneta et al.

(Continued)

FOREIGN PATENT DOCUMENTS

JP        11044693 A  *  2/1999

OTHER PUBLICATIONS

McGlade, S. M. and Jones, G. R., An Optically Powered Vibrating Quartz Force Sensor, GEC Journal of Research, vol. 2, No. 2, 1984.

(Continued)

*Primary Examiner*—Georgia Epps
*Assistant Examiner*—Brian J. Livedalen
(74) *Attorney, Agent, or Firm*—John A. Thomas

(57) ABSTRACT

We disclose an apparatus and method for detecting probe-tip contact with a surface, generally inside a focused ion-beam instrument, where the probe tip is attached to a capsule, and the capsule is movably secured in a probe shaft. There is a fiber-optic cable having a first end and a second end; a beam splitter having first and second output ports; and a light source connected to the beam splitter. The first output port of the beam splitter is connected to the first end of the fiber-optic cable, and the second output port of the beam splitter is connected to a photodiode. The second end of the fiber-optic cable has a mirror for reflecting incident light at approximately a ninety-degree angle to the axis of the optical path in the fiber-optic cable and onto the capsule, so that the intensity of the light reflected back from the capsule through the fiber-optic cable is proportional to the deflection of the capsule as the probe tip makes contact with the surface.

18 Claims, 2 Drawing Sheets

U.S. PATENT DOCUMENTS

| | | |
|---|---|---|
| 6,576,910 B2 | 6/2003 | Hashikawa et al. |
| 6,617,569 B2 | 9/2003 | Narita et al. |
| 6,668,628 B2 | 12/2003 | Hantschel et al. |
| 6,713,743 B2 * | 3/2004 | Kim et al. ............... 250/201.3 |
| 6,717,156 B2 | 4/2004 | Sugaya et al. |
| 6,744,268 B2 | 6/2004 | Hollman |
| 6,879,407 B2 | 4/2005 | Inoue et al. |
| 6,888,139 B2 | 5/2005 | Tsuneta et al. |
| 7,057,154 B2 | 6/2006 | Kitamura et al. |
| 2002/0056808 A1 | 5/2002 | Tsuneta et al. |
| 2002/0122186 A1 | 9/2002 | Igaki et al. |
| 2002/0195576 A1 | 12/2002 | Inoue et al. |
| 2003/0217772 A1 | 11/2003 | Lu et al. |
| 2003/0236586 A1 | 12/2003 | Tomimatsu et al. |
| 2004/0051878 A1 | 3/2004 | Schick |
| 2004/0061872 A1 * | 4/2004 | Nakano ..................... 356/623 |
| 2004/0129868 A1 | 7/2004 | Kilmartin |
| 2004/0144924 A1 | 7/2004 | Asselbergs et al. |
| 2004/0151417 A1 | 8/2004 | Lagakos et al. |
| 2004/0251412 A1 | 12/2004 | Tappel |
| 2004/0251413 A1 | 12/2004 | Suzuki et al. |
| 2005/0035302 A1 | 2/2005 | Morrison |
| 2005/0054115 A1 | 3/2005 | Von Harrach et al. |

OTHER PUBLICATIONS

Karrai, Khaled, Grober, Robert D., Piezo-electric tuning fork tip-sample distance control for near field optical microscopes, Ultramicroscopy 61 (1995) 197-205.

Bauer, P., Hecht, B., Rossel, C., Piezoresistive cantilevers as optical sensors for scanning near-field microscopy, Ultramicroscopy 61 (1995) 127-130.

Clijnen, J., Reynaerts, D., Van Brussel H., Design of an optical tri-axial force sensor, Katholieke Universiteit Leuven, Department of Mechanical Engineering.

* cited by examiner

APPARATUS AND METHOD OF DETECTING PROBE TIP CONTACT WITH A SURFACE

CLAIM FOR PRIORITY

This application claims the priority of U.S. provisional application Ser. No. 60/624,650, titled "Method and apparatus for the automated process of in-situ lift-out inside a charged particle beam microscope using an in-situ probe tip replacement system," filed Nov. 3, 2004.

CO-PENDING APPLICATIONS

United States patent application Ser. No. 11/186,073, entitled "Method and apparatus for in-situ probe tip replacement inside a charged particle beam microscope," filed Jul. 21, 2005.

TECHNICAL FIELD

This application relates to the detection of contact between a nano-manipulator probe and a sample or object of interest inside a charged-particle instrument, such as a focused ion-beam microscope.

BACKGROUND

The use of focused ion-beam (FIB) microscopes has become common for the preparation of specimens for later analysis in the transmission electron microscope (TEM). The structural artifacts, and even some structural layers, in the device region and interconnect stack of current integrated-circuit devices can be too small to be reliably detected with the secondary electron imaging in a Scanning Electron Microscope (SEM), or FIB, which offers a bulk surface imaging resolution of approximately 3 nm. In comparison, TEM inspection offers much finer image resolution (<0.1 nm), but requires electron-transparent (<100 nm thick) sections of the sample mounted on 3 mm diameter grid disks.

The in-situ lift-out technique is a series of FIB milling and sample-translation steps used to produce a site-specific specimen for later observation in a TEM or other analytical instrument. During in-situ lift-out, a wedge-shaped section (the "lift-out sample") of material containing the region of interest is first completely excised from the bulk sample, such as a semiconductor wafer or die, using ion-beam milling in the FIB. This lift-out sample is typically 10×5×5 μm in size. Removal of the lift-out sample is then typically performed using an internal nano-manipulator in conjunction with the ion-beam assisted chemical-vapor deposition (CVD) process available with the FIB tool. A suitable nano-manipulator system is the Omniprobe AutoProbe 200™, manufactured by Omniprobe, Inc., of Dallas, Tex. Automated lift-out of a sample is a desirable goal, and an apparatus and method for same is described in the co-pending application cited above. An important aspect of such an automated in-situ lift-out process is the ability to move the nano-manipulator probe tip inside the vacuum chamber of the microscope and detect mechanical contact. The field of application of the disclosure is limited neither to automated lift-out systems, nor to semiconductor samples. Other objects of interest could be micro-mechanical systems, or biological specimens.

DRAWINGS

DESCRIPTION

After the sample (180) is excised from a substrate, the probe tip (120) can be connected to it using one of the methods disclosed in U.S. Pat. No. 6,570,170, for example. An important aspect of this step is the detection of the moment when the contact has occurred, so the movement of the probe tip (120) can be stopped.

Figure 1:
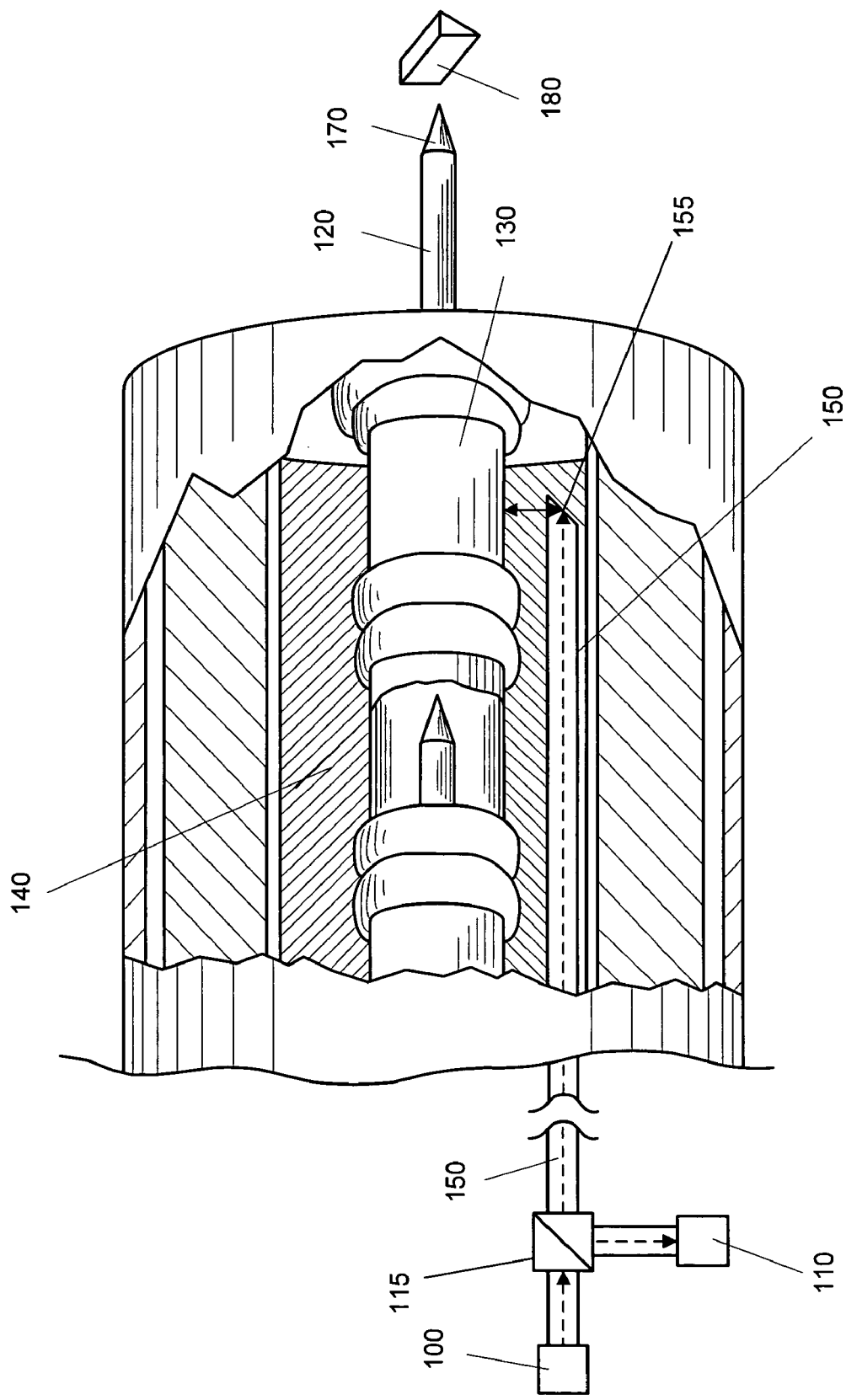
FIG. 1 shows the preferred embodiment before contact of the probe tip with an object.
Figure 2:
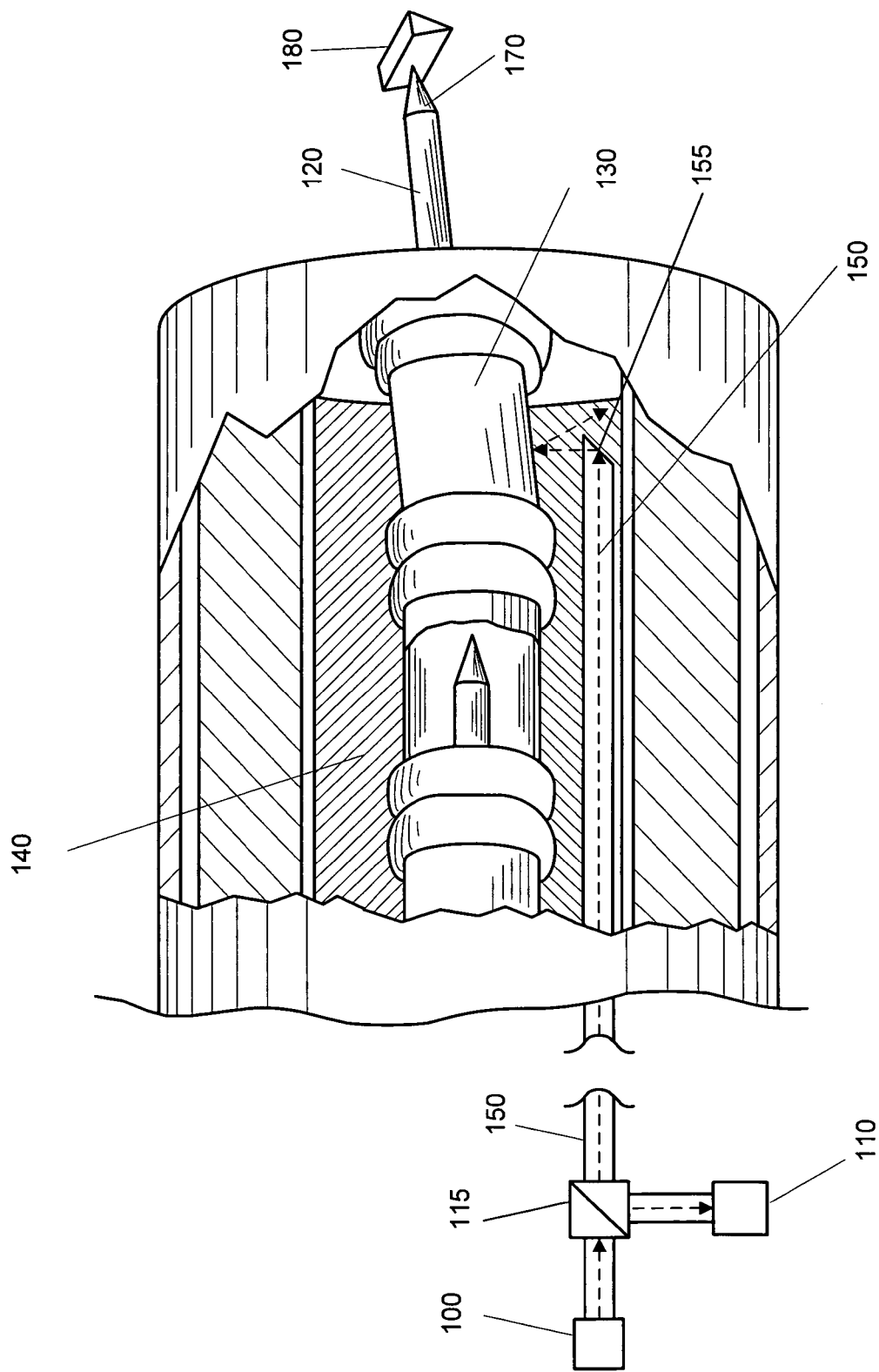
FIG. 2 shows deflection of the probe tip as it makes contact, and the detection of this deflection by the change in the light reflected from the probe tip or capsule.

In the embodiment depicted in FIGS. 1 and 2, the verification of contact with the sample is confirmed by sensing a change in the amount of light received by a light detector (110) in an optical path (150). In the embodiment illustrated here, the probe tip (120) is attached to a capsule (130) movably secured in a probe shaft (140). The probe tip (120) and its point (170) extend from the capsule (130), as shown in the figures. The distance between the probe tip (120) and the wall of the preceeding capsule (130) is exaggerated for clarity in the figures.

In the automated embodiment shown, the capsules (130) are aligned in a queue with the capsule (130) of each probe tip (120) enclosing the following probe tip (120). The queue of probe tips (120) is urged through the inside of the probe shaft (140) as new probe tips (120) are required by a particular lift-out sequence. The optical path (150) illustrated is preferably fiber-optic cable, but could be a free path for light. Equivalently, the light path (150) could be attached to the outside of the probe shaft (140) with an aperture in the probe shaft (140) to allow transmission of light to the capsule (130).

FIG. 1 shows the preferred embodiment before the probe-tip point (170) has made contact with a sample (180). Light from a light source (100) is directed into the first end of the fiber-optic cable (150). The fiber-optic cable (150) is cut at approximately a 45-degree angle at its second end, and the cut end is polished and coated with a reflective substance, such as aluminum, to convert it to a mirror (155). The fiber-optic cable (150) is disposed so the light coming out its second end is directed by the mirror (155) at approximately a ninety-degree angle to the axis of the cable (150), onto the surface of a capsule (130) securing a probe tip (120). Light is thus reflected back through the cable (150), through a beam splitter (115), to a light detector (110). The light detector (110) registers the intensity of light received. The light source (100) is typically a laser diode or a light-emitting diode. The intensity of the light source (100) should be substantially constant, but may be modulated for better detectability if the signal-to-noise ratio of the reflected light is low.

The light detector (110) may be a PIN photodiode, photomultiplier or similar detector. In practice of the automated lift-out process, the signal from the light detector (110) would be operatively coupled to a programmed computer (not shown) that commands an automated lift-out sequence.

During the normal course of operation, the light source (100) is turned off. It is turned on when the automated system signals a close approach, or a close approach is detected manually. The close approach can be detected by the imaging means in the FIB chamber and by known methods such as image recognition and parallax detection.

While the probe tip (120) is moving, the light detector (110) continuously registers the intensity of the light energy flux. When probe-tip point (170) touches a sample (180), the probe tip (120), and a capsule (130) attached to it, are forced to shift from their original position, so the direction of reflected light is changed, as shown in FIG. 2. Therefore, the intensity of light returning back through the fiber optic cable (150) and the beam splitter (115) to the light detector (110) is changed. The light detector (110) emits a signal proportional to the change of intensity, where the signal is appropriate for input to a digital computer.

The light contact detection approach can be used for both one probe tip (120) and a series of probe tips (120), because the fiber optic cable (150) is connected to the probe shaft (140), either on its inside or outside, and not to a probe tip (120) or a capsule (130).

We claim:

1. An apparatus for detecting probe-tip contact with a surface, where the probe tip is attached to a capsule, and the capsule is movably secured in a probe shaft; the apparatus comprising:
   an optical path having a first end and a second end;
   a beam splitter having first and second output ports;
   a light source connected to the beam splitter;
   the first output port of the beam splitter connected to the first end of the optical path;
   the second output port of the beam splitter connected to a light detector;
   the second end of the optical path having a mirror for reflecting incident light at approximately a 90-degree angle to the axis of the optical path and onto the capsule; so that,
the intensity of the light reflected back from the capsule through the optical path is proportional to the deflection of the capsule as the probe tip makes contact with the surface.

2. The apparatus of claim 1 where the optical path is a fiber-optic cable.

3. The apparatus of claim 1 where the mirror is disposed across the end of the optical path at approximately a 45 degree angle.

4. The apparatus of claim 1 where the optical path is a free path for light.

5. The apparatus of claim 1 where the light source is a light-emitting diode.

6. The apparatus of claim 1 where the light source is a laser diode.

7. The apparatus of claim 1 where the light detector is a photodiode.

8. The apparatus of claim 1 where the light detector is a photomultiplier tube.

9. An apparatus for detecting probe-tip contact with a surface, where the probe tip is attached to a capsule, and the capsule is movably secured in a probe shaft; the apparatus comprising:
   a fiber-optic cable having a first end and a second end;
   a beam splitter having first and second output ports;
   a light source connected to the beam splitter;
   the first output port of the beam splitter connected to the first end of the fiber-optic cable;
   the second output port of the beam splitter connected to a photodiode;
   the second end of the fiber-optic cable having a mirror for reflecting incident light at approximately a ninety-degree angle to the axis of the optical path in the fiber-optic cable and onto the capsule; so that,
the intensity of the light reflected back from the capsule through the fiber-optic cable is proportional to the deflection of the capsule as the probe tip makes contact with the surface.

10. An apparatus for detecting probe-tip contact with a surface, where the probe tip is attached to a capsule, and the capsule is movably secured in a probe shaft; the apparatus comprising:
   a fiber-optic cable having a first end and a second end;
   a beam splitter having first and second output ports;
   a light-emitting diode connected to the beam splitter;
   the first output port of the beam splitter connected to the first end of the fiber-optic cable;
   the second output port of the beam splitter connected to a photodiode;
   the second end of the fiber-optic cable having a mirror for reflecting incident light at approximately a ninety-degree angle to the axis of the optical path and onto the capsule; so that,
the intensity of the light reflected back from the capsule through the fiber-optic cable is proportional to the deflection of the capsule as the probe tip makes contact with the surface.

11. An method for detecting probe-tip contact with a surface, where the probe tip is attached to a capsule, and the capsule is movably secured in a probe shaft; the method comprising:
   providing an optical path inside the probe shaft;
   providing a light source connected to the optical path;
   measuring the intensity of the light reflected back through the optical path from the capsule; so that,
   the intensity of the light reflected back from the capsule through the optical path is proportional to the deflection of the capsule as the probe tip makes contact with the surface.

12. The method of claim 11 where the optical path is a fiber-optic cable.

13. The method of claim 11 where the optical path is a free path for light.

14. The method of claim 11 where the light source is a light-emitting diode.

15. The method of claim 11 where the light source is a laser diode.

16. The method of claim 11 where the measurement of the intensity of the reflected light source further comprises:
   providing a light detector in the optical path for measuring light reflected from the capsule; and,
   converting the output of the light detector to a signal suitable for input to a programmed digital computer.

17. The method of claim 16 where the light detector is a photodiode.

18. The method of claim 16 where the light detector is a photomultiplier tube.

* * * * *